United States Patent
Munnelly et al.

(10) Patent No.: US 6,893,797 B2
(45) Date of Patent: May 17, 2005

(54) HIGH SPEED NEGATIVE-WORKING THERMAL PRINTING PLATES

(75) Inventors: Heidi M. Munnelly, Windsor, CO (US); Paul R. West, Fort Collins, CO (US); Shashikant Saraiya, Parlin, NJ (US); Jian Bing Huang, Trumbull, CT (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 258 days.

(21) Appl. No.: 10/217,005

(22) Filed: Aug. 12, 2002

(65) Prior Publication Data

US 2003/0124460 A1 Jul. 3, 2003

Related U.S. Application Data

(63) Continuation-in-part of application No. 10/040,241, filed on Nov. 9, 2001.

(51) Int. Cl.$^7$ .............................................. G03F 7/031
(52) U.S. Cl. ............................ 430/284.1; 430/285.1; 430/944; 430/273.1
(58) Field of Search .......................... 430/284.1, 285.1, 430/944

(56) References Cited

U.S. PATENT DOCUMENTS

| | | | |
|---|---|---|---|
| 4,511,645 A | 4/1985 | Koike et al. | 430/276.1 |
| 4,997,745 A | 3/1991 | Kawamura et al. | 430/281.1 |
| 5,368,990 A | 11/1994 | Kawabata et al. | 430/281 |
| 5,491,046 A | 2/1996 | DeBoer et al. | 430/302 |
| 5,496,903 A | 3/1996 | Watanabe et al. | 526/204 |
| 5,545,676 A | 8/1996 | Palazzotto et al. | 522/15 |
| 5,756,258 A | 5/1998 | Yamaoka et al. | 430/281.1 |
| 5,763,134 A | 6/1998 | Busman et al. | 430/157 |
| 5,821,030 A | 10/1998 | West et al. | |
| 5,942,372 A | 8/1999 | West et al. | 430/281.1 |
| 6,027,857 A | 2/2000 | Li et al. | 430/283.1 |
| 6,153,356 A | 11/2000 | Urano et al. | 430/281.1 |
| 6,309,792 B1 | 10/2001 | Hauck et al. | 430/270.1 |
| 6,558,875 B1 * | 5/2003 | Toshimitsu et al. | 430/302 |
| 2003/0118939 A1 * | 6/2003 | Munnelly et al. | 430/286.1 |

FOREIGN PATENT DOCUMENTS

| | | |
|---|---|---|
| DE | 19648313 | 5/1997 |
| EP | 0131824 | 1/1985 |
| EP | 0611997 | 8/1994 |
| EP | 0672544 | 9/1995 |
| EP | 0672954 | 9/1995 |
| EP | 0522175 | 11/1997 |
| EP | 0924570 | 6/1999 |
| JP | 09034110 | 2/1997 |
| JP | 11038633 | 2/1999 |
| JP | 2001-100434 * | 4/2001 |
| JP | 2001159816 | 6/2001 |
| WO | 99/46310 | 9/1999 |
| WO | 00/48836 | 8/2000 |

OTHER PUBLICATIONS

Publication No.: 2001–100434 and machine translation of claims into English of JP 2001–100434, 3 pages dated Apr. 13, 2001 from Patent Abstracts of Japan, Searching PAJ, Japan Patent Office.*

Derwent–Acc–No: 2001–604805, Dwerent Information LTD, 2 pages , English abstract of JP 2001100434 and US 6558875 B1 earliest document date evidenced of Apr. 13, 2001, Derwent–Week 2000369, copyright 1999 Derwent Information LTD.*

* cited by examiner

*Primary Examiner*—Cynthia Hamilton
(74) *Attorney, Agent, or Firm*—RatnerPrestia

(57) ABSTRACT

Negative working thermally imageable elements useful as lithographic printing plate precursors and methods for their use are disclosed. The elements have a substrate, a layer of imageable composition over the substrate, and, optionally, an overcoat layer over the layer of imageable composition. The imageable composition has an allyl-functional polymeric binder. Optimum resolution and on-press performance can be attained without a post-exposure bake. The elements do not require a post-exposure bake and can be used in on-press development applications.

17 Claims, No Drawings

HIGH SPEED NEGATIVE-WORKING THERMAL PRINTING PLATES

CROSS REFERENCE TO RELATED APPLICATIONS

This application is a continuation-in-part of U.S. application Ser. No. 10/040,241, filed Nov. 9, 2001, incorporated herein by reference.

FIELD OF THE INVENTION

The invention relates to imageable elements useful in lithographic printing. More particularly, this invention relates to thermally imageable elements useful as lithographic printing plate precursors.

BACKGROUND OF THE INVENTION

In lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful for the preparation of lithographic printing plates typically comprise an imageable layer over the hydrophilic surface of a substrate. The imageable layer comprises one or more radiation-sensitive components, which may be dispersed in a suitable binder. Alternatively, the radiation-sensitive component can also be the binder.

If after exposure to radiation the exposed regions of the imageable layer are removed in the developing process revealing the underlying hydrophilic surface of the substrate, the element is positive working. Conversely, if the developing process removes the unexposed regions and the exposed regions remain, the element is negative working. In each instance, the regions of the radiation-sensitive layer (i.e., the image areas) that remain are ink-receptive and the regions of the substrate surface revealed by the developing process accept water, typically a fountain solution, and repel ink.

Direct digital imaging of printing plate precursors, which obviates the need for exposure through a negative, is becoming increasingly important in the printing industry. Negative working imageable elements useful as lithographic printing plate precursors that can be imaged with infrared lasers are described, for example, in EP-A-0 672 544; EP-A-0 672 954; DeBoer, U.S. Pat. No. 5,491,046; and EP-A-0 819 985. Some of these elements require a post-exposure bake, that is, after imaging and before developing, the imaged element must be heated briefly to a temperature of about 85 to about 135° C. to cure the imaged regions. This requires a large amount of energy, necessitates use of a large processor for development, and limits throughput.

Despite improvements that have been made in negative-working imageable elements there is a continuing need for elements that do not require a post-exposure bake, and for elements that have higher speed, that is elements that require less energy for imaging.

SUMMARY OF THE INVENTION

In one aspect, the invention is an imageable element useful as a lithographic printing plate precursor. The imageable element comprises:

a substrate; and
an imageable layer comprising an imageable composition over the substrate; the imageable composition comprising:
(i) at least one allyl-functional polymeric binder, the allyl-functional polymeric binder comprising about 0.7 to about 8.0 meq of allyl-functionality per gram of polymeric binder;
(ii) at least one cyanine dye capable of absorbing infrared radiation;
(iii) at least one free-radical polymerizable compound; and
(iv) a free-radical generating system comprising:
(a) at least one polyhaloalkyl-substituted compound capable of producing free radicals, and
(b) at least one carboxylic acid represented by the formula:

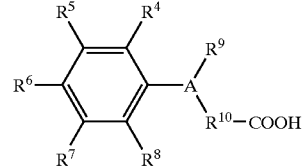

in which:
$R^4$, $R^5$, $R^6$, $R^7$ and $R^8$ are each independently selected from the group consisting of hydrogen, alkyl, aryl, halogen, alkoxy, hydroxyalkyl, carboxy, carboxyalkyl, alkylthio, alkylsulfonyl, sulfonic, alkylsulfonate, dialkylamino, acyl, alkoxycarbonyl, cyano and nitro; or $R^4$ and $R^5$, $R^5$ and $R^6$, $R^6$ and $R^7$, or $R^7$ and $R^8$ together form an aromatic or aliphatic ring;
$R^9$ is selected from the group consisting of hydrogen, alkyl, aryl, hydroxyalkyl, carboxyalkyl, acyl, alkoxycarbonyl, alkylsulfonyl and alkylsulfonate; or $R^9$ is an electron pair;
$R^{10}$ is an alkylene group of $C_1$–$C_6$ carbon atoms; or $R^8$ and $R^{10}$ together form a heterocyclic ring; or $R^9$ and $R^{10}$ together form a heterocyclic ring, or either $R^9$ or $R^{10}$ forms a heterocyclic ring with $R^4$ or $R^8$; and
A is a heteroatom selected from the group consisting of N, O, and S.

In one embodiment the imageable element additionally comprises an overcoat layer. In another embodiment the carboxylic acid is selected from the group consisting of N-phenyliminodiacetic acid, N-(carboxymethyl)-N-phenylglycine, and (3,4-dimethoxyphenylthio)acetic acid.

In another aspect, the invention is a method for forming an image useful as a lithographic printing plate, or printing form, by imaging and developing the imageable element.

DETAILED DESCRIPTION OF THE INVENTION

Unless the context indicates otherwise, in the specification and claims, the terms allyl-functional polymeric binder, free radical-polymerizable compound, free radical-producing compound, triazine, photothermal conversion material, cyanine dye, carboxylic acid, and similar terms also include mixtures of such materials. Unless otherwise specified, all percentages are percentages by weight. Total solids refers to the amount of non-volatile material in the composition (i.e., the composition exclusive of coating solvent) even though some of the materials may be liquids at room temperature.

Imageable Elements

The imageable element comprises, in order, a substrate, an imageable layer, and, optionally, an overcoat layer.

Substrate

The substrate comprises a support, which may be any material conventionally used to prepare imageable elements useful as lithographic printing plates. The support is preferably strong, stable and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Metal supports include aluminum, zinc, titanium, and alloys thereof. The substrate preferably has at least one hydrophilic surface over which imageable layer is applied.

Typically, polymeric films contain a sub-coating on one or both surfaces to modify the surface characteristics to enhance the hydrophilicity of the surface, to improve adhesion to subsequent layers, to improve planarity of paper substrates, and the like. The nature of this layer or layers depends upon the substrate and the composition of subsequent coated layers. Examples of subbing layer materials are adhesion-promoting materials, such as alkoxysilanes, amino-propyltriethoxysilane, glycidoxypropyltriethoxysilane and epoxy functional polymers, as well as conventional subbing materials used on polyester bases in photographic films.

The surface of an aluminum support may be treated by techniques known in the art, including physical graining, electrochemical graining, chemical graining, and anodizing. The substrate should be of sufficient thickness to sustain the wear from printing and be thin enough to wrap around a printing form, typically from about 100 to about 600 $\mu$m. Typically, the substrate comprises an interlayer between the aluminum support and the imageable layer. The interlayer may be formed by treatment of the support with, for example, silicate, dextrin, hexafluorosilicic acid, phosphate/fluoride, polyvinyl phosphonic acid (PVPA) or vinyl phosphonic acid copolymers.

The back side of the substrate (i.e., the side opposite the underlayer) may be coated with an antistatic agent and/or a slipping layer or matte layer to improve handling and "feel" of the imageable element.

Imageable Layer

The imageable layer, which comprises a layer of an imageable composition, is over the substrate. The imageable composition comprises at least one free-radical polymerizable compound, at least one allyl-functional polymeric binder, at least one cyanine dye, and a free-radical generating system. The free radical generating system comprises at least one carboxylic acid and at least one polyhaloalkyl-substituted compound capable of producing free radicals. The imageable composition may also comprise other ingredients such as dyes and surfactants that are conventional ingredients of imageable compositions.

Polymeric Binder

The allyl-functional polymeric binders are organic polymers that comprise allyl groups. The allyl-functional polymeric binder contains about 0.7 to about 8.0 meq of allyl-functionality per gram of polymeric binder (about $7 \times 10^{-4}$ to about $8.0 \times 10^{-3}$ mol of allyl-functionality per gram of polymeric binder).

Allyl-functional acrylates and methacrylates, that is, polymers and copolymers of allyl acrylate and/or allyl methacrylate are a preferred group of binders. These include homopolymers, such as poly(allyl methacrylate), and copolymers of these monomers with other monomers, such as acrylic acid and methacrylic acid and their alkyl esters such as methyl acrylate, methyl methacrylate, ethyl acrylate, ethyl methacrylate, butyl acrylate, butyl methacrylate, etc; vinyl acetate; styrene; maleic anhydride; and acrylonitrile.

Another preferred group of binders is the allyl-functional polyurethanes, that is polyurethanes that contain allyl groups, which may be either pendent or terminal allyl groups. Allyl-functional polyurethane may be prepared by reaction of a diisocyanate with an excess of an allyl-functional diol to produce the polyurethane. Alternatively, the allyl-functional polyurethane may be prepared by reaction of a diisocyanate with a carboxyl functional diol, such as dimethylol propionic acid. The carboxyl groups of the resulting polyurethane are then converted to into allyl ester groups by esterification with, for example, allyl alcohol.

Commercially available diols having an allyl group include 3-allyloxy-1,2-propanediol and trimethylolpropane allyl ether. Other diols having an allyl ester group include allyl 4,4-bis(hydroxyethyloxyphenyl)-pentanoate and allyl 2,2-bis(hydroxymethyl)propanoate. A preferred diol is 3-allyloxy-1,2-propanediol:

$$(HO)CH_2-CH(OH)-CH_2-O-CH_2-CH=CH_2$$

These allyl-functional diols may be used alone or in combination; or further in combination with a diol that does not comprise allyl-functionality, provided that the resulting allyl-functional polymeric binder has about 0.7 to about 8.0 meq of allyl-functionality per gram of polymeric binder. Examples of useful diols not containing allyl-functionality that may be used in combination with an allyl-functional diol or mixture of allyl-functional diols include ethylene glycol, diethylene glycol, polyethylene glycol, propylene glycol, polypropylene glycol, neopentyl glycol, 1,4-butanediol, and 1,6-hexanediol.

The allyl-functional polyurethane may also comprise acidic groups, i.e. groups with a $pK_a$ of 7 or less, such as sulfonic acid, phosphoric acid, phosphonic acid, or, preferably, carboxylic acid. They may be prepared by reaction of an excess of a mixture of allyl-functional diol and a diol that comprises one or more acidic groups with a diisocyanate as described above. Useful diols that comprise one or more acidic groups include, for example, dialkanol alkyl sulfonic acids, dialkanol alkyl phosphoric acids, and dialkanol alkyl phosphonic acids.

Preferably, the allyl-functional polyurethane that comprises acidic groups is a carboxyl, allyl-functional polyurethane. Carboxyl, allyl-functional polyurethanes may be prepared by reaction of a diisocyanate with an excess of a mixture of allyl-functional diol and a carboxyl functional diol to produce the polyurethane. Diol mixtures, as described above, may be used instead of a single allyl-functional diol, provided that the resulting allyl-functional polymeric binder has about 0.7 to about 8.0 meq of allyl-functionality per gram of carboxyl, allyl-functional polyurethane.

Useful carboxyl functional diols include, for example, dialkanol alkanoic acids, such as 2,2-bis(hydroxymethyl) propionic acid, (2,2-dimethylol propanoic acid), 2,2-bis(2-hydroxyethyl) propionic acid, 2,2-bis(3-hydroxypropyl) propionic acid, bis(hydroxymethyl)acetic acid, bis(4-hydroxyphenyl)acetic acid, 2,2-bis(hydroxymethyl) butyric acid, 2,2-bis(hydroxymethyl) pentanoic acid, and tartaric acid; dihydroxybenzoic acids such as 3,5-dihydroxybenzoic acid; and dihydroxy dicarboxylic acids derived by reaction of dianhydrides with diols, such as the reaction product of a dianhydride such as pyromellitic dianhydride, 3,3',4,4'-benzophenone tetracarboxylic dianhydride, 3,3',4,4'-diphenyl tetracarboxylic dianhydride, or 2,3,6,7-naphthalene tetracarboxylic dianhydride with a diol such as ethylene glycol, diethylene glycol, triethylene glycol, polyethylene glycol, 1,2- or 1,3-propanediol, polypropylene glycol, 1,2- or 1,4-butanediol, neopentyl glycol, or 1,6-hexanediol.

Aromatic and/or aliphatic diisocyanates may be used to form the polyurethane. Aromatic diisocyanates include, for example, 2,4-toluene diisocyanate, 2,6-toluene diisocyanate, p-xylene diisocyanate, m-xylene diisocyanate, tetramethylxylene diisocyanate, 4,4-diphenylmethane diisocyanate, 1,5-naphthalene diisocyanate, and 3,3'-dimethylbiphenyl-4,4'-diisocyanate. Aliphatic diisocyanates include, for example, hexamethylene diisocyanate, trimethylhexamethylene diisocyanate, isophorone diisocyanate, 4,4-methylene-bis(cyclohexyl isocyanate), methylcyclohexane-2,4- and 2,6-diisocyanate, and 1,4-bis(isocyanatomethyl) cyclohexane. Aromatic diisocyanates are preferred.

The polymeric binder has an average molecular weight of about 5,000 to about 1,000,000, preferably 100,000 or less, more preferably 75,000 or less, still more preferably 50,000 or less, as determined by gel permeation chromatography. The polymeric molecules may be linear or branched and, preferably have polydispersities of 1 to 5. In one aspect, the polymer has an acid number of 0 to 70 mg KOH/g of allyl-functional polymeric binder. In another aspect, the polymer has an acid number of 0 to 50 mg KOH/g of allyl-functional polymeric binder. In yet another aspect, the polymer has an acid number of 0 to 30 mg KOH/g of allyl-functional polymeric binder.

The imageable composition preferably comprises about 30 to about 60 wt %, more preferably about 35 to about 45 wt %, of the allyl-functional polymeric binder, based on the weight of the total solids in the imageable composition.

Free Radical-Polymerizable Compound

The imageable composition comprises at least one ethylenically unsaturated free radical-polymerizable compound. These compounds have at least one carbon-carbon double bond, and preferably are multifunctional, that is they have two or more unsaturated double bonds, preferably terminal unsaturated double bonds. These compounds are selected from unsaturated free radical-polymerizable monomers, unsaturated oligomers which are free radical-polymerizable, and mixtures thereof.

Typical multifunctional unsaturated free radical-polymerizable monomers are unsaturated esters of alcohols, preferably acrylate and methacrylate esters of polyols, such as, trimethylolpropane tri- and tetra-acrylate and methacrylate, the tri- and tetra-acrylate and methacrylate esters of ethoxylated trimethylolpropane, diethylene glycol diacrylate and dimethacrylate, triethylene glycol diacrylate and dimethacrylate, tetraethylene glycol diacrylate and dimethacrylate, polyethylene glycol diacrylate and dimethacrylate, glycerol tri-acrylate and tri-methacrylate, ethylene glycol dimethacrylate, pentaerythritol tri- and tetra-acrylate and methacrylate, dipentaerythrol penta- and hexa-acrylate and methacrylate, tripropylene glycol diacrylate and dimethacrylate, the di-(2-acryloxyethyl)ether and the di-(2-methacryloxyethyl)ether of bisphenol A, ethoxylated bisphenol A diacrylate and dimethacrylate, 1,6-hexanediol diacrylate and dimethacrylate, neo-pentyl glycol diacrylate and dimethacrylate, and butanediol diacrylate and dimethacrylate. Typical monofunctional unsaturated free radical-polymerizable monomers, which are sometimes used in combination with other free radical-polymerizable compounds include, for example, 2-hydroxyethyl methacrylate, 2-hydroxypropl methacrylate, 2-ethoxyethyl acrylate and methacrylate, 2-(2-ethoxyethoxy) ethyl acrylate and methacrylate, 2-ethylhexyl acrylate and methacrylate, octyl acrylate and methacrylate, lauryl acrylate and methacrylate, 2-phenoxyethyl acrylate and methacrylate, and tetrahydrofurfuryl acrylate and methacrylate.

Other unsaturated free radical-polymerizable monomers include, for example, unsaturated amides, such as 1,6-hexamethylene bis-acrylamide, vinyl esters such as divinyl succinate, divinyl phthalate, and divinyl benzene-1,3-disulfonate, styrene, divinyl benzene, and derivatives thereof, and N-vinyl compounds, such as N-vinyl pyrrolidone and N-vinyl carbazole. Unsaturated free radical-polymerizable oligomers and/or prepolymers, include, for example, urethane acrylates and methacrylates, epoxide acrylates and methacrylates, polyester acrylates and methacrylates, polyether acrylates and methacrylates or unsaturated polyester resins, may also be used.

Preferred radical-polymerizable compounds are pentaerythritol tetraacrylate and tetramethacrylate, dipentaerythritol pentaacrylate and pentamethacrylate, di(trimethylol propane) tetraacrylate and tetramethacrylate, diethyleneglycol diacrylate and dimethacrylate, and oligomeric urethane acrylates and methacrylates.

The imageable composition preferably comprises about 35 to about 60 wt %, more preferably about 45 to about 55 wt %, of the free radical-polymerizable compound, based on the total solids in the imageable composition.

Photothermal Conversion Material

The imageable composition comprises a photothermal conversion material. Photothermal conversion materials absorb radiation, especially infrared radiation, and convert it to heat. Although the binder may comprise an absorbing moiety, i.e., be a photothermal conversion material, typically the photothermal conversion material is a separate compound.

The photothermal conversion material is a cyanine dye. Useful cyanine dyes have a maximum absorption wavelength ($\lambda_{max}$) in some part of the electromagnetic spectrum greater than about 750 nm, that is in the infrared region and near infrared region of the spectrum. More particularly, they should have high absorptivity in the region used for imaging, typically from about 780 nm to about 1300 nm and, more typically, from about 800 nm to about 1100 nm. More preferred are cyanine dyes of the formula (A):

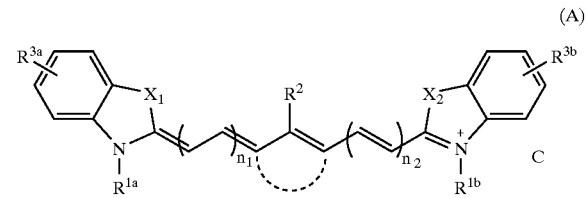

in which:

$X_1$ and $X_2$ are each independently S, O, NR or C(alkyl)$_2$;

$R^{1a}$ and $R^{1b}$ are each independently an alkyl group, an alkylsulfonate group, an alkylcarboxylate group or an alkylammonium group;

$R^2$ is hydrogen, halogen, SR, SO$_2$R, OR or NR$_2$;

$R^{3a}$ and $R^{3b}$ are each independently a hydrogen atom, an alkyl group, COOR, OR, SR, NR$_2$, a halogen atom, or a substituted or unsubstituted benzofused ring;

R is an alkyl group or an aryl group;

C is a counterion present in sufficient amount to produce charge neutrality for the cyanine dye;

——— is either two hydrogen atoms or a two-carbon or three-carbon chain; and $n_1$ and $n_2$ are each independently 0, 1, 2 or 3.

These cyanine dyes absorb in the range of 750 nm to 1100 nm. Dyes that absorb from about 790 nm to about 850 nm in methanol solution are preferred.

$X_1$ and $X_2$ are each preferably a $C(alkyl)_2$ group, in which the alkyl groups are preferably independently alkyl groups of 1 to 4 carbon atoms and more preferably methyl groups. $R^{1a}$ and $R^{1b}$ are each preferably an alkyl group with 1 to 4 carbon atoms. $R^2$ is preferably SR. $R^{3a}$ and $R^{3b}$ are each preferably a hydrogen atom. R is preferably a phenyl group.

C will in some cases be a negative ion, in some cases a positive ion, and in some cases will not be needed at all, depending on the total charge contributed by $R^{1a}$ and $R^{1b}$. For instance, if $R^{1a}$ and $R^{1b}$ both bear a single negative charge, C must bear a positive charge and be present at a level of one equivalent of C per mole of cyanine dye. If instead $R^{1a}$ and $R^{1b}$ are both neutral alkyl groups, C must bear a negative charge and be present at a level of one equivalent of C per mole of cyanine dye. Other combinations of positively charged, negatively charged, and neutral embodiments of $R^{1a}$ and $R^{1b}$ are of course possible, and the required number of equivalents of C can be readily determined by those skilled in the art.

If a negative counterion is needed, C is the conjugate base of a strong acid, such as trifluoromethanesulfonate, perfluorobutyrate, hexafluorophosphate, perchlorate, or a mixture of any of these. Preferably, C is chloride or tosylate. If a positive counterion in needed, C is $Na^+$, $K^+$, $Li^+$, $NH4^+$, alkylammonium such as triethyl ammonium, or a mixture of any of these.

Especially preferred are infrared absorbing dyes with a symmetrical formula (A). Examples of such especially preferred dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclopenten-1-yl]-ethenyl]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. The following are also useful infrared absorbers:

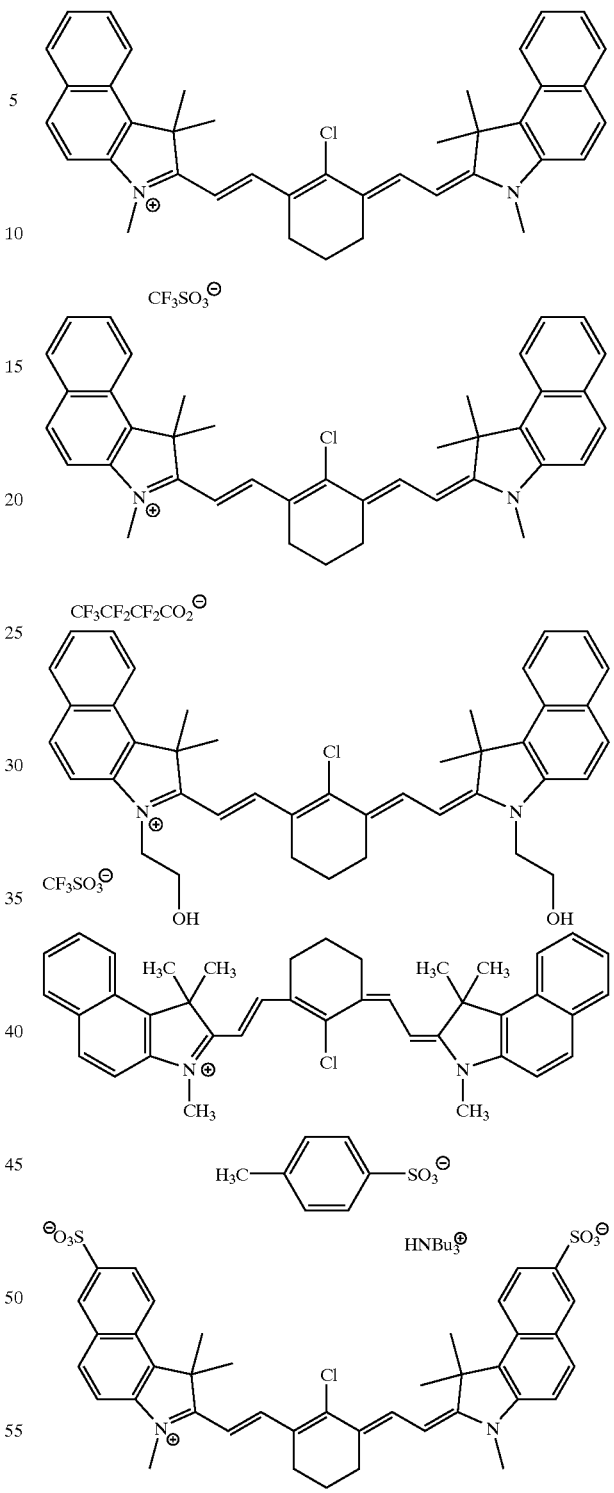

The amount of photothermal conversion material in the element is generally sufficient to provide an optical density of at least 0.05, and preferably, an optical density of from about 0.5 to about 3 at the imaging wavelength. As is well known to those skilled in the art, the amount of an absorber required to produce a particular optical density can be determined from the thickness of the layer and the extinction coefficient of the absorber at the wavelength used for imaging using Beers law. The composition preferably comprises about 0.5 to about 8 wt %, more preferably about 1 to about 3 wt % of the photothermal conversion material, based on the total solids in the imageable composition.

Free Radical-Producing Compound

The free radical-generating system of the imageable composition comprises a polyhaloalkyl-substituted free radical-producing compound or a mixture of polyhaloalkyl-substituted free radical-producing compounds. These compounds comprise at least either one polyhalogenated or several monohalogenated or dihalogenated alkyl substituents. The halogenated alkyl group preferably has 1 to 3 carbon atoms. A preferred halogenated alkyl group is the halogenated methyl group.

Suitable polyhaloalkyl-substituted compounds include, for example: halo-substituted-s-triazines, such as 2,4,6-tris (trichloromethyl)-s-triazine, 2,4,6-tris(tribromomethyl)-s-triazine; 2-phenyl-4,6-bis(trichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine; and other halogenated compounds, such as tribromomethyl phenylsulfone, and 1,2,3,4-tetrabromo-n-butane.

The composition preferably comprises about 2 to about 15 wt %, more preferably about 4 to about 7 wt %, polyhaloalkyl-substituted free radical-producing compound or a mixture of polyhaloalkyl-substituted free radical-producing compounds, based on the total solids in the composition.

The absorption properties of the polyhaloalkyl-substituted compound determine the daylight stability of the imageable element. If a high degree of daylight stability is desired, polyhaloalkyl-substituted compounds that do not have significant ultraviolet/visible absorption at >330 nm are preferred.

Carboxylic Acid

The free radical-generating system of the imageable composition comprises a carboxylic acid of the formula (B):

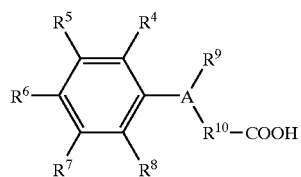

(B)

in which:

$R^4$, $R^5$, $R^6$, $R^7$ and $R^5$ are each independently selected from the group consisting of hydrogen, alkyl, aryl, halogen, alkoxy, hydroxyalkyl, carboxy, carboxyalkyl, alkylthio, alkylsulfonyl, sulfonic, alkylsulfonate, dialkylamino, acyl, alkoxycarbonyl, cyano and nitro; or $R^4$ and $R^5$, $R^5$ and $R^6$, $R^6$ and $R^7$, or $R^7$ and $R^8$ together form an aromatic or aliphatic ring;

$R^9$ is selected from the group consisting of hydrogen, alkyl, aryl, hydroxyalkyl, carboxyalkyl, acyl, alkoxycarbonyl, alkylsulfonyl and alkylsulfonate; or $R^9$ is an electron pair;

$R^{10}$ is an alkylene group of $C_1$–$C_6$ carbon atoms, preferably methylene; or $R^8$ and $R^{10}$ together form a heterocyclic ring; or $R^9$ and $R^{10}$ together form a heterocyclic ring, or either $R^9$ or $R^{10}$ forms a heterocyclic ring with, $R^4$ or $R^8$; and A is a heteroatom selected from the group consisting of N, O, and S; preferably nitrogen.

These carboxylic acids are disclosed in West, U.S. Pat. No. 5,942,372, especially column 10, line 27, to column 12, line 67, the disclosure of which patent is incorporated herein by reference. Examples are N-phenyliminodiacetic acid (also named anilino diacetic acid); p-chlorophenyl-iminodiacetic acid; p-bromophenyl-iminodiacetic acid; (p-acetamidophenylimino)diacetic acid; 3-(bis (carboxymethyl)amino)benzoic acid; 4-(bis(carboxymethyl) amino)benzoic acid; 2-((carboxymethyl)phenylamino) benzoic acid; 2-((carboxymethyl)methylamino)benzoic acid; 2-((carboxymethyl)methylamino)-5-methoxybenzoic acid; 3-(bis(carboxymethylamino)-2-naphthalenecarboxylic acid; N-(4-aminophenyl)-N-(carboxymethyl)glycine; N,N'-1,3-phenylenebisglycine; N,N'-1,3-phenylenebis-N-(carboxymethyl)!glycine; N,N'-1,2-phenylenebis-N-(carboxymethyl)!glycine; N-(carboxymethyl)-N-(4-methoxyphenyl)glycine; N-(carboxymethyl)-N-(3-methoxyphenyl)glycine; N-(carboxymethyl)-N-(3-hydroxyphenyl)glycine; N-(carboxymethyl)-N-(3-chlorophenyl)glycine; N-(carboxymethyl)-N-(4-bromophenyl)glycine; N-(carboxymethyl)-N-(4-chlorophenyl)glycine; N-(carboxymethyl)-N-(4-bromophenyl)glycine; N-(carboxymethyl)-N-(2-chlorophenyl)glycine; N-(carboxymethyl)-N-(4-ethylphenyl)glycine; N-(carboxymethyl)-N-(2,3-dimethylphenyl)glycine; N-(carboxymethyl)-N-(3,4-dimethylphenyl)glycine; N-(carboxymethyl)-N-(3,5-dimethylphenyl)glycine; N-(carboxymethyl)-N-(2,4-dimethylphenyl)glycine; N-(carboxymethyl)-N-(2,6-dimethylphenyl)glycine; N-(carboxymethyl)-N-(4-formylphenyl)glycine; N-(carboxymethyl)-N-ethylanthranilic acid; N-(carboxymethyl)-N-propylanthranilic acid; 5-chloro-N-(carboxymethyl) anthranilic acid; 5-bromo-N-(carboxymethyl)anthranilic acid; N-(2-carboxyphenyl)glycine; o-dianisidine-N,N,N',N'-tetraacetic acid; N,N'-(1,2-ethanediylbis(oxy-2,1-phenylene)bis-N-(carboxymethyl)glycine); 4-carboxyphenoxyacetic acid; catechol-o,o'-diacetic acid; 4-methylcatechol-o,o'-diacetic acid; resorcinol-o,'-diacetic acid; hydroquinone-o,o'-diacetic acid; alpha-carboxy-o-anisic acid; 4,4'-isopropylidenediphenoxyacetic acid; 2,2'-(dibenzofuran-2,8-diyldioxy)diacetic acid; 2-(carboxymethylthio)benzoic acid; 5-amino-2-(carboxymethylthio)benzoic acid; 3-((carboxymethyl)thio)-2-naphthalenecarboxylic acid; and indoleacetic acid, 4-carboxyindoleacetic acid, 5-carboxyindoleacetic acid, 6-carboxyindole-acetic acid, 6-carboxyindoleacetic acid, 7-carboxymethylindoleacetic acid, 6-bromoindoleacetic acid, 6-cyanoindoleacetic acid, and other substituted indoleacetic acids. The most preferred aromatic carboxylic acids are N-phenyliminodiacetic acid; N-(carboxymethyl)-N-phenylglycine; and (3,4-dimethoxyphenylthio)acetic acid.

The composition preferably comprises about 1 to about 10 wt %, more preferably about 1.5 to about 3 wt %, of the carboxylic acid, based on the total solids of the imageable composition.

Other Ingredients

The imageable composition may comprise a dye to aid in the visual inspection of the exposed and/or developed element. Printout dyes distinguish the exposed regions from the unexposed regions during processing. Contrast dyes distinguish the unimaged regions from the imaged regions in the developed imageable element. Preferably the dye does not absorb the imaging radiation. Triarylmethane dyes, such as ethyl violet, crystal violet, malachite green, brilliant green, Victoria blue B, Victoria blue R, and Victoria pure blue BO, may act as a contrast dye.

Heterocyclic mercapto compound comprising an aromatic 5-membered heterocyclic ring with a thiol group substituted thereon, may be used as shelf life improvers for the imageable composition. Preferred heterocyclic mercapto compounds include 3-mercapto-1,2,4-triazole; 2-mercaptobenzimidazole; 2-mercaptobenzoxazole; 5-mercapto-3-methylthio-1,2,4-thiadiazole; and 2-mercapto-1-methylimidazole.

Overcoat Layer

An essentially oxygen-impermeable overcoat layer, which is soluble in the developer and transparent to to the radiation used for imaging, may be applied over the imageable layer. This layer is not only useful as an oxygen barrier but also protects the imageable element against ablation during imaging. The overcoat layer also improves the scratch resistance of the imageable element, which makes it easier to handle.

Overcoat layers are described in WO 99/06890. Preferred binders for the overcoat layer are water-soluble polymers such as polyvinyl alcohol, polyvinyl alcohol/polyvinyl acetate copolymers, polyvinyl pyrrolidone, vinyl pyrrolidone/vinyl acetate copolymers, polyvinyl methyl ether, ring-opened copolymers of maleic anhydride and co-monomers such as methyl vinyl ether, polyacrylic acid, gelatine, cellulose ethers, and mixtures thereof. Most preferred is polyvinyl alcohol.

The overcoat layer may also contain coloring agents (water soluble dyes) that do not absorb in the imaging wavelength region, typically between 800 and 1200 nm, but efficiently absorb visible light, thereby improving the stability of the element to ambient visible radiation. To improve the adhesion of the overcoat layer to the imageable layer, an adhesion promoter can be added to the overcoat layer formulation. One example for such an adhesion promoter is poly(vinyl imidazole) as disclosed in WO 99/06890.

The coating weight of the overcoat layer is preferably 0.1 to 6 g/m$^2$, and more preferably 0.5 to 4 g/m$^2$.

Preparation of the Imageable Elements

The imageable elements may be prepared by applying a layer of imageable composition over a surface, typically over a hydrophilic surface, of the substrate using conventional coating or lamination methods. Typically the ingredients are dispersed or dissolved in a suitable coating solvent, and the resulting mixtures coated by conventional methods, such as spin coating, bar coating, gravure coating, roller coating, dip coating, air knife coating, hopper coating, blade coating, and spray coating. The term "coating solvent" includes mixtures of solvents, especially mixtures of organic solvents.

A variety of conventional organic solvents, for example, alcohols such as methyl alcohol, ethyl alcohol, n- and i-propyl alcohols, n- and i-butyl alcohols and diacetone alcohol; ketones such as acetone, methyl ethyl ketone, methyl propyl ketone, diethyl ketone, and cyclohexanone; polyhydric alcohols and derivatives thereof such as ethylene glycol, ethylene glycol monomethyl ether or its acetate, ethylene glycol monoethyl ether or its acetate; ethylene glycol diethylether, ethylene glycol monobutyl ether or its acetate, propylene glycol monomethyl ether or its acetate, propylene glycol monoethyl ether or its acetate, propylene glycol monobutyl ether, 3-methyl-3-methoxybutanol; and special solvents such as N,N-dimethylformamide, methyl lactate, and ethyl lactate, can be used as the coating solvent for the imageable layer. However, for convenience during the drying process, solvents having a boiling point of between about 40° C. and about 160° C., preferably between about 60° C. and about 130° C., are typically used. The solids content of the coating solution is typically about 2 to about 25 wt %, based on the weight of the solvent. Selection of the coating solvent for the imageable layer will also depend on the nature of the binder or binders; the cyanine dye or dyes, the polyhaloalkyl-substituted compound or compound, the carboxylic acid or acids, and the free radical-polymerizable compound or compounds.

Drying of the precursor is usually carried out using heated air. The air temperature is preferably between about 30° C. and about 200° C., more preferably between about 40° C. and about 120° C. The air temperature may be held constant during the drying process, or may be gradually stepped up. Following drying, the coating weight of the imageable layer is typically about 0.5 to about 4 g/m$^2$, preferably about 1 to about 3 g/m$^2$.

When present, the overcoat layer may be applied over the imageable layer using conventional coating or lamination techniques. To prevent mixing of the layers during coating, the overcoat layer is preferably coated from a solvent in which the imageable layer is essentially insoluble. Typical coating solvents for the overcoat layer are water and aqueous solvents that contain small amounts of organic solvents such as methanol, ethanol, or i-propyl alcohol.

Imaging and Processing of the Plate Precursor

The imageable elements may be imaged with a laser or an array of lasers emitting modulated near infrared or infrared radiation in a wavelength region that is absorbed by the element. Infrared radiation, especially infrared radiation in the range of about 800 nm to about 1200 nm, is typically used for imaging thermally imageable elements. Imaging is conveniently carried out with a laser emitting at about 830 nm or at about 1064 nm. Suitable commercially available imaging devices include image setters such as the Creo Trendsetter (CREO, British Columbia, Canada) and the Gerber Crescent 42T (Gerber).

Imaging produces an imaged element, which comprises a latent image of exposed (imaged) regions and unexposed (unimaged) regions. Development of the imaged element to form a lithographic printing plate, or printing form, converts the latent image to an image by removing the imageable layer in the unexposed regions, revealing the underlying hydrophilic surface of the substrate. The developer typically removes the overcoat layer in both the exposed and unexposed regions.

The developer may be any liquid or solution that can penetrate and remove the unexposed regions of the imageable layer without substantially affecting the complementary unexposed regions. Common components of aqueous developers include surfactants; chelating agents such as, salts of ethylenediamine tetraacetic acid; organic solvents, such as, benzyl alcohol; and alkaline components, such as, metasilicates, amines, hydroxides and bicarbonates. Useful developers are aqueous solutions having a pH of about 7 or above. Preferred alkaline developers are those that have a pH between about 8 and about 13.5, typically at least about 9, preferably at least about 10. Wholly aqueous developers, i.e., those that do not comprise an added organic solvent, may be used. Although the composition of the developer will depend on the composition of the imageable layer and, if present, the underlayer, the developer typically is an aqueous composition comprising metasilicates. Alkaline developers are available, for example, from Kodak Polychrome Graphics LLC.

Development is typically carried out in a processor equipped with an immersion-type-developing bath, a section for rinsing with water, and a drying section. Typically, the developer is applied to the imaged element by rubbing or wiping the element with an applicator containing the developer. Alternatively, the imaged element may be brushed with the developer or the developer may be applied to the precursor by spraying the element with sufficient force to remove the exposed regions. Development may be carried out in a commercially available processor, such as a PK-910 processor (available from Kodak Polychrome Graphics). Following development, the lithographic printing plate is typically rinsed with water and dried. Drying may be conveniently carried out by infrared radiators or with hot air.

In conventional negative-working thermally imageable elements, a post exposure bake is necessary to produce a printing plate that has optimum resolution and on-press performance. That is, after imaging and before development, it is necessary to heat the exposed imageable element briefly to a temperature of about 85° C. to about 135° C. to cure the exposed regions. Depending on the temperature used, this takes about 20 seconds to about 100 seconds. A special processor with built-in heaters is required for elements that require a post-exposure bake. This processor has a large footprint, i.e., takes up a lot of space, and consumes much more energy than processors that do not have ovens for post-exposure baking. However, a post-exposure bake is not required with the elements of the invention. Optimum resolution and on-press performance are obtained without a post-exposure bake.

For printing, the lithographic printing plate is mounted on a lithographic printing press. Printing may be carried out by applying a fountain solution and then lithographic ink to the image on the surface of the plate. The fountain solution is taken up by the imaged (exposed) regions, i.e., the surface of the hydrophilic substrate revealed by imaging and development, and the ink is taken up by the unimaged (unexposed) regions. The ink is then transferred to a suitable receiving material (such as cloth, paper, metal, glass or plastic) either directly or indirectly through the use of an intermediate offset printing blanket to provide an impression of the image.

INDUSTRIAL APPLICABILITY

Although the imageable compositions of this invention may be used in a number of applications, such as recording materials for creating images on suitable carriers and receiving sheets, they are particularly useful for preparing negative-working lithographic printing plate precursors imageable by infrared radiation. In particular, they are useful as lithographic printing plate precursors that do not require a post-exposure, pre-development bake. Because these elements do not require a post-exposure bake, they can be used in "develop-on-press" applications. The imaged element can be directly mounted on press after imaging and developed with ink and/or fountain solution during the initial prints. No separate development step is needed before mounting on press. This eliminates the development step along with both the processor and developer, thus simplifying the printing process, reducing the amount of expensive equipment required, and eliminating the waste disposal problems associated with the disposal of spent developer.

These elements also have increased infrared sensitivity. The imaging energy is about 10–20 mJ/cm$^2$ less that that for the elements disclosed in WO 00/48836 (about 120 mJ/cm$^2$). Because of this increased sensitivity and the elimination of the post-exposure bake, the number of elements that can be imaged and processed in a given time period is increased, and energy consumption is reduced. In addition, image quality is more reproducible without the post-exposure bake.

The advantageous properties of this invention can be observed by reference to the following examples, which illustrate but do not limit the invention.

EXAMPLES

| Glossary | |
|---|---|
| AIRVOL ® 203 | Poly (vinyl alcohol), about 88% hydrolyzed (Air Products, Allentown, PA, USA) |
| BYK 307 | Polyethoxylated dimethylpolysiloxane copolymer (Byk-Chemie, Wallingford, CT, USA) |
| DESMODUR ® N 100 | Solvent-free, aliphatic polyisocyanate polymer based on hexamethylene diisocyanate (Bayer, Leverkusen, Germany) |
| IR Dye | 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride |
| Jagotex MA 2814/MP | Terpolymer containing 43.3% styrene, 45% methyl methacrylate, and 11.7% acrylic acid; MW about 90,000 (Ernst Yager) |
| JONCRYL ® 683 | Acrylic polymer with an acid number of 150; MW about 10,000 (S. C. Johnson, Racine, WI, USA) |
| MDI | 4,4'-Methylrene-bis(phenylisocyanate) |
| Sartomer 355 | Ditrimethylolpropane tetraacrylate multifunctional acrylic monomer (Sartomer Co) |
| Urethane Acrylate | 80% methylethylketone solution of an urethane acrylate obtained by reacting DESMODUR ® N100 and hydroxyethyl acrylate and pentaerythrol triacrylate with a double bond content of 0.5 double bonds per 100 g after completion of the reaction of the isocyanate groups |
| YKR-3030 | Phthalocyanine dye (Yamamoto Chemicals) |

Example 1

This example describes the preparation of an acrylic polymer containing allyl and carboxylic acid-functionality.

A mixture of allyl methacrylate (21.4 g), methacrylic acid (3.59 g), azo-bis-iso-butyronitrile (AIBN) (0.2 g), and dodecyl mercaptan (0.06 g) in 2-butanone (909.5 g) was charged into a four-necked 2-L flask fitted with a heating mantle, temperature controller, mechanical stirrer, condenser, pressure-equalized addition funnel and nitrogen inlet. The reaction mixture was heated to 80° C. Then a mixture of allyl methacrylate (64.0 g), methacrylic acid (11.0 g), AIBN (0.4 g), and dodecyl mercaptan (0.19 g) was added over 1.5 hr. Then additional AIBN (0.1 g) was added, followed by addition of additional AIBN (0.5 g) over several hours. After 11 hr, the conversion of monomer to allyl-functional polymeric binder was greater than 98%.

The allyl-functional polymeric binder was precipitated in powder form by addition of a mixture of hexane (2.2 Kg) with stirring at 4000 rpm for about 10 to 15 min, using a Series 2000, Model #84, Laboratory Dispersator. The product was filtered off and dried at room temperature for 24 hr. The acid number of the resulting allyl-functional polymeric binder was 85 mg of KOH per gram of allyl-functional polymeric binder versus a calculated value of 95.2 mg of KOH per gram of allyl-functional polymeric binder.

Example 2

This example describes the preparation a homopolymer of allyl methacrylate.

A mixture of allyl methacrylate (25.0 g), AIBN (0.2 g), and dodecyl mercaptan (0.06 g) in 2-butanone (907.2 g) was charged into a four-necked 2-L flask fitted with a heating mantle, temperature controller, mechanical stirrer, condenser, pressure-equalized addition funnel and nitrogen inlet. The reaction mixture was heated to 80° C. Then a mixture of allyl methacrylate (75.0 g), AIBN (0.4 g), and dodecyl mercaptan (0.19 g) was added over 1.5 hr. Then additional AIBN (0.1 g) was added, followed by addition of additional AIBN (0.5 g) over several hours. After 10 hr, the conversion of monomer to polymer was greater than 93%.

The allyl-functional polymer was precipitated in powder form by addition of a mixture of hexane (2.2 Kg) with stirring at 4000 rpm for about 10 to 15 min, using a Series 2000, Model #84, Laboratory Dispersator. The polymer was filtered off and dried at room temperature for 24 hr. The allyl-functional polymer had about 7.93 meq of allyl-functionality per gram of allyl-functional polymeric binder. The acid number was 70 mg KOH per gram of allyl-functional polymeric binder.

Example 3

This example describes the preparation of an acrylic polymer containing allyl and carboxylic acid-functionality.

A mixture of allyl methacrylate (15.86 g), butyl methacrylate (5.55 g), methacrylic acid (3.59 g), AIBN (0.2 g), and dodecyl mercaptan (0.06 g) in 2-butanone (907.2 g) was charged into a four-necked 2-L flask fitted with a heating mantle, temperature controller, mechanical stirrer, condenser, pressure-equalized addition funnel and nitrogen inlet. The reaction mixture was heated to 80° C. Then a mixture of allyl methacrylate (48.0 g), butyl methacrylate (16.0 g), methacrylic acid (11.0 g), AIBN (0.4 g), and dodecyl mercaptan (0.19 g) was added over 1.5 hr. Then additional AIBN (0.1 g) was added, followed by addition of additional AIBN (0.6 g) over several hours. After 13 hr, the conversion of monomer to polymer was greater than 98%.

The allyl-functional polymer was precipitated in powder form by addition of hexane (2.0 Kg) to the reaction mixture with stirring at 4000 rpm for about 10 to 15 min, using a Series 2000, Model #84, Laboratory Dispersator. The product was filtered off and dried at room temperature for 24 hr. The acid number of the resulting allyl-functional binder was 91 mg of KOH gram of allyl-functional polymeric binder versus a calculated value of 95.2 mg of KOH per gram of allyl-functional polymeric binder.

Example 4

This example describes the preparation of an allyl, carboxy-functional polyurethane polymer from MDI, 3-allyloxy-1,2-propanediol, and 2,2-dimethylol propanoic acid. The MDI to 3-allyloxy-1,2-propanediol to 2,2-dimethylol propanoic acid molar ratio was 1.00:0.50:0.55.

N,N-Dimethylacetamide (352.1 g) was charged into a four-necked 1-L flask fitted with a heating mantle, temperature controller, mechanical stirrer, condenser, pressure-equalized addition funnel and nitrogen inlet. Then MDI (150.4 g) (0.6 mol) was added slowly with stirring at room temperature. After 10 min, 2,2-dimethylol propanoic acid (40.2 g) (0.3 mol) was added at ambient temperature. The temperature of the reaction mixture increased to 57° C. Then 3-allyloxy-1,2-propanediol (43.6 g) (0.33 mol) was added over 30 min. The reaction mixture was stirred for an additional 2 hr. Completion of the reaction was determined by the disappearance of the isocyanate infrared absorption band at 2275 $cm^{-1}$. The resulting clear solution had a kinematic viscosity of $Z_1$ (Gardner-Holt) at 40% non-volatiles.

The carboxyl, allyl-functional polymeric binder was precipitated in powder form by addition of a mixture of water (4.5 kg) and ice (1.5 kg) with stirring, using a Silverston Model #L4RT-A multi-purpose high shear laboratory mixer at 6000 rpm. The mixture was stirred at 4000 rpm for about 10 to 15 min using a Series 2000, Model #84, Laboratory Dispersator. The allyl-functional polymer was filtered off and dried at 60° C. in a drying oven. The allyl-functional polymer had about 1.41 meq of allyl-functionality per gram of polymer. The acid number of the allyl-functional binder was 57 mg of KOH per gram of allyl-functional polymeric binder.

Example 5–7

These examples describe preparation and imaging of imageable elements that have either the polymer of Example 1, the polymer of Example 2, or the polymer of Example 3 in the imageable layer.

An imageable layer coating solution containing the components listed in Table 1 was prepared.

TABLE 1

| Component | Parts by Weight |
|---|---|
| Urethane acrylate | 3.55 |
| Sartomer 355 | 0.74 |
| Polymer[a] | 3.24 |
| 2-(4-Methoxyphenyl)-4,6-bis(trichloromethyl)-2-triazine | 0.40 |
| N-phenyliminodiacetic acid | 0.22 |
| IR Dye | 0.08 |
| Crystal Violet | 0.10 |
| Byk 307 | 0.02 |
| Methyl ethyl ketone | 13.75 |
| Toluene | 22.91 |
| 1-Methoxy-2-propanol | 54.99 |

[a]Example 5 contains the polymer of Example 1, Example 6 the polymer of Example 2, and Example 7 the polymer of Example 3.

The coating solutions were coated with a wire-wound rod onto electrochemically grained and anodized aluminum which had a poly(vinylphosphonic) acid post-treatment. The dry coating weight of the resulting imageable layer was 2 $g/m^2$. The resulting elements were dried at about 94° C. for 60 sec residence time in a Ranar conveyor oven.

The overcoat layer coating solution was prepared from 5.26 parts of AIRVOL® 203, 0.93 parts poly(vinylimidazole), 3.94 parts i-propyl alcohol, and 89.87 parts water. The coating solution was applied over the imageable layer with a wire-wound rod. The resulting imageable elements were dried at 94° C. for 90 sec residence time in a Ranar conveyor oven. The overcoat layer also had a dry coating weight of 2 $g/m^2$.

These imageable elements were imaged on a Creo Trendsetter 3244x at 2 W and 35 to 250 rpm. This exposure series ranged from 20 to 150 $mJ/cm^2$. The minimum exposure energy necessary to achieve maximum processed density for Examples 5, 6, and 7 was 118 $mJ/cm^2$, 146 $mJ/cm^2$ and 150 mJ/cm², respectively. The imaged imageable elements were processed without a post-exposure bake through a Technigraph PHW-32 processor charged with 980 developer, alkaline (pH 10) 2-phenoxyethanol containing negative plate developer (Kodak Polychrome Graphics, Norwalk, Conn., USA) to produce lithographic printing plates.

The plates of Example 6, mounted on a Miehle sheet-fed press, produced about 35,000 excellent reproductions with Equinox ink and a hard blanket.

Example 8

This example describes preparation and imaging of an imageable element comprising an allyl, carboxy-functional polyurethane polymer.

The procedure of Example 5 was repeated except that the polymer prepared in Example 4 was used. The minimum exposure energy necessary to achieve maximum processed density was 79 mJ/cm².

Comparative Example 1

This example describes the preparation and imaging of an imageable element in which the imageable layer contains polymers that do not contain allyl-functionality.

Imageable elements were prepared and imaged as in Examples 5–7 except that the polymers of Examples 1–3 were substituted with a mixture of 1.62 parts of Jagotex MA 2814/MP and 1.62 parts of JONCRYL® 683. The imaged imageable elements were processed in a Technigraph PHW-32 processor charged with 980 developer. The processor was equipped with a preheat oven that allowed the imaged imageable elements to reach a backside temperature of 125° C.

When the imaged imageable element was preheated before development, the minimum exposure energy necessary to achieve maximum processed density was 117 mJ/cm². When the preheat oven was disabled so that the imaged imageable element was not preheated before processing, the imaged imageable layer was completely removed by processing.

Comparative Example 2

This example indicates that phthalocyanine dyes are not effective in the elements of the invention.

The procedure of Example 5 was repeated except that YKR-3030 was substituted for the IR dye. The resulting elements were imaged on a Creo Trendsetter 3244x at 4 W and 35 to 250 rpm. This exposure series ranged from 36 to 258 mJ/cm². The imaged imageable elements were processed without a post-exposure bake through a Technigraph PHW-32 processor charged with 980 developer. The imaged imageable layer was completely removed by processing.

Comparative Examples 3–6

The procedure of Example 5 was repeated except that the coating solution was modified as shown in Table 2. The imageable elements were imaged on a Creo Trendsetter 3244x at 4 W and 35 to 250 rpm. This exposure series ranged from 36 to 258 mJ/cm². The resulting imaged imageable elements were processed without a post-exposure bake through a Technigraph PHW-32 processor charged with 980 developer.

The decrease in sensitivity, or the minimum energy necessary to achieve maximum processed density, compared to Example 6 is shown in Table 2. Imageable elements in which the imageable layer contains an onium salts, such as an iodonium or a diazo compound, require more energy for imaging than the composition of Example 6.

TABLE 2

Modifications to the Coating Solution in Example 5

| Comparative Example | Formula Alteration | Decrease in Sensitivity compared to Example 6 |
|---|---|---|
| 3 | Diphenyliodonium hexafluorophosphate replaced 2-(4-methoxyphenyl)-4,6-bis(trichloromethyl)-2-triazine | 1.62-fold; clean background |
| 4 | 2-Methoxy-4-(phenylamino)-benzenediazonium hexafluorophosphate replaced 2-(4-methoxyphenyl)-4,6-bis(trichloromethyl)-2-triazine | 1.78-fold; background scumming |
| 5 | Diphenyliodonium hexafluorophosphate replaced 2-(4-methoxyphenyl)-4,6-bis(trichloromethyl)-2-triazine and N-phenyliminodiacetic acid | 1.94-fold; clean background |
| 6 | 2-Methoxy-4-(phenylamino)-benzenediazonium hexafluorophosphate replaced 2-(4-methoxyphenyl)-4,6-bis(trichloromethyl)-2-triazine and N-phenyliminodiacetic acid | 1.81-fold; clean background |

Having described the invention, we now claim the following and their equivalents.

What is claimed is:

1. An imageable element comprising:
a substrate; and
an imageable layer comprising an imageable composition over the substrate; the imageable composition comprising:
(i) at least one allyl-functional polymeric binder, the allyl-functional polymeric binder comprising about 0.7 to about 8.0 meq of allyl-functionality per gram of polymeric binder;
(ii) at least one cyanine dye capable of absorbing infrared radiation; and
(iii) at least one free-radical polymerizable compound; and
(iv) a free-radical generating system comprising:
(a) at least one polyhaloalkyl-substituted compound capable of producing free radicals, and
(b) at least one carboxylic acid represented by the formula:

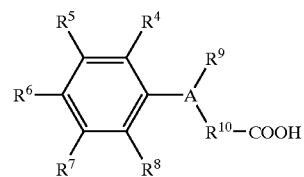

in which:
$R^4$, $R^5$, $R^6$, $R^7$ and $R^8$ are each independently selected from the group consisting of hydrogen, alkyl, aryl, halogen, alkoxy, hydroxyalkyl, carboxy, carboxyalkyl, alkylthio, alkylsulfonyl, sulfonic, alkylsulfonate, dialkylamino, acyl, alkoxycarbonyl, cyano and nitro; or $R^4$ and $R^5$, $R^5$ and $R^6$, $R^6$ and $R^7$, or $R^7$ and $R^8$ together form an aromatic or aliphatic ring;
$R^9$ is selected from the group consisting of hydrogen, alkyl, aryl, hydroxyalkyl, carboxyalkyl, acyl, alkoxycarbonyl, alkylsulfonyl and alkylsulfonate; or $R^9$ is an electron pair;

$R^{10}$ is an alkylene group of $C_1$–$C_6$ carbon atoms; or $R^8$ and $R^{10}$ together form a heterocyclic ring; or $R^9$ and $R^{10}$ together form a heterocyclic ring, or either $R^9$ or $R^{10}$ forms a heterocyclic ring with $R^4$ or, $R^8$; and A is a heteroatom selected from the group consisting of N, O, and S;

in which the allyl-functional polymeric binder has an acid number of zero.

2. The imageable element of claim 1 in which $R^{10}$ is methylene and A is N.

3. The imageable element of claim 1 in which the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-1,3,5-triazine, and 2,4,6-tris(tribromomethyl)-s-triazine.

4. The imageable element of claim 3 in which the carboxylic acid is selected from the group consisting of N-phenyliminodiacetic acid, N-(carboxymethyl)-N-phenylglycine, and (3,4-dimethoxyphenylthio)acetic acid.

5. The imageable element of claim 1 in which the element additionally comprises an overcoat layer over the imageable layer.

6. The imageable element of claim 5 in which the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine.

7. The imageable element of claim 6 in which the carboxylic acid is selected from the group consisting of N-phenyliminodiacetic acid, N-(carboxymethyl)-N-phenylglycine, and (3,4-dimethoxyphenylthio)acetic acid.

8. The imageable element of claim 1 in which the allyl-functional polymeric binder is selected from the group consisting of allyl-functional acrylates and methacrylates and allyl-functional polyurethanes.

9. The imageable element of claim 8 in which:
the element additionally comprises an overcoat layer over the imageable layer;
the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine; and
the carboxylic acid is selected from the group consisting of N-phenyliminodiacetic acid, N-(carboxymethyl)-N-phenylglycine, and (3,4-dimethoxyphenylthio)acetic acid.

10. The element of claim 8 in which the allyl-functional polymeric binder is selected from the group consisting of allyl-functional acrylates and methacrylates.

11. The element of claim 8 in which the allyl-functional polymeric binder is selected from the group consisting of allyl-functional polyurethanes.

12. The element of claim 11 in which:
the element additionally comprises an overcoat layer over the imageable layer;
the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine; and
the carboxylic acid is selected from the group consisting of N-phenyliminodiacetic acid, N-(carboxymethyl)-N-phenylglycine, and (3,4-dimethoxyphenylthio)acetic acid.

13. The element of claim 11 in which the allyl-functional polymeric binder is prepared by reaction of a diisocyanate with 3-allyloxy-1,2,-propanediol.

14. The element of claim 1 in which allyl-functional polymeric binder is a homopolymer of allyl acrylate, a homopolymer of allyl methacrylate, or a copolymer of allyl acrylate and allyl methacrylate.

15. The element of claim 14 in which:
the element additionally comprises an overcoat layer over the imageable layer;
the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine; and
the carboxylic acid is selected from the group consisting of N-phenyliminodiacetic acid, N-(carboxymethyl)-N-phenylglycine, and (3,4-dimethoxyphenylthio)acetic acid.

16. The element of claim 1 in which the allyl-functional polymeric binder is selected from the group consisting of copolymers of (a) one or more monomers selected from the group consisting of allyl acrylate and allyl methacrylate with (b) one of more monomers selected from the group consisting of alkyl esters of acrylic acid, alkyl esters of methacrylic acid, styrene, vinyl acetate, and acrylonitrile.

17. The element of claim 16 in which:
the element additionally comprises an overcoat layer over the imageable layer;
the polyhaloalkyl-substituted compound capable of producing free radicals is a halo-substituted-s-triazine selected from the group consisting of 2,4,6-tris(trichloromethyl)-s-triazine, 2,4,6-tris(tribromomethyl)-s-triazine; 2-phenyl-4,6-bistrichloromethyl)-s-triazine, 2-(4-methoxyphenyl)-4,6-bis(trichloromethyl)-s-triazine, 2-(4-chlorophenyl)-4,6-bis(trichloromethyl)-s-triazine, 2-(4-methylthiophenyl)-4,6-bis(trichloromethyl)-s-triazine, and 2,4,6-tris(tribromomethyl)-s-triazine; and
the carboxylic acid is selected from the group consisting of N-phenyliminodiacetic acid, N-(carboxymethyl)-N-phenylglycine, and (3,4-dimethoxyphenylthio)acetic acid.

* * * * *